SILICON SEMICONDUCTOR DEVICE

Filed Feb. 23. 1961

INVENTORS
GOTTHOLD ZIELASEK &
HILDEGARD UHLIG
BY
ATTORNEY

United States Patent Office 3,209,218

Patented Sept. 28, 1965

3,209,218

SILICON SEMICONDUCTOR DEVICE

Gotthold Zielasek and Hildegard Uhlig, Stuttgart, Germany, assignors to Robert Bosch G.m.b.H., Stuttgart, Germany Filed Feb. 23, 1961, Ser. No. 91,159
Claims priority, application Germany, Feb. 25, 1960, B 56,812
8 Claims. (Cl. 317—240)

Figures 1, 2:
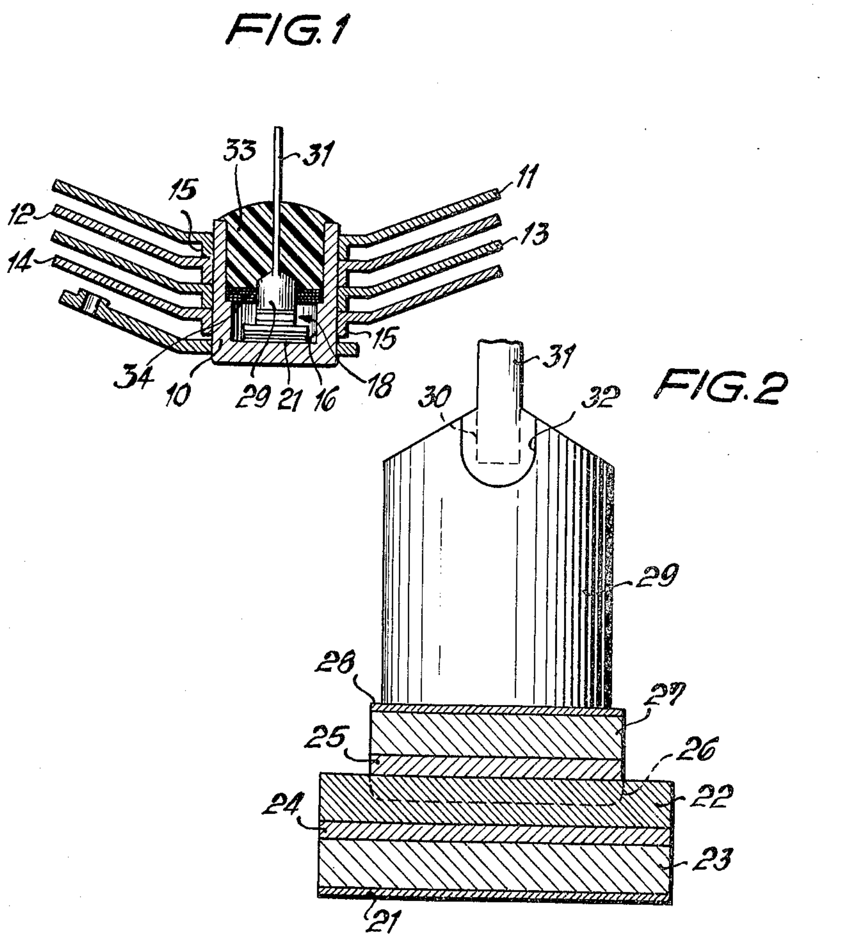

The present invention relates to silicon power rectifiers and the like semiconductor devices of the general type comprising a thin plate or layer of mono-crystalline semiconductor material of one conductivity type to one face of which is applied in barrier layer-free or non-rectifying contact connection a plate or layer of carrier metal having a coefficient of thermal expansion equal or approximately equal to the coefficient of expansion of the semiconductor material, such as of molybdenum, nickel or nickel-iron in the case of silicon used as a semiconductor, said metal layer being affixed by soldering in large-surface contact to the surface of the semiconductor. The opposite surface of the semiconductor is formed with a layer of opposite conductivity to provide a PN-rectifier junction, such as by fusing or alloying a layer of a suitable impurity material into the semiconductor surface, in a manner well known in the art.

With rectifiers of the type mentioned difficulties have been encountered in the past in soldering the silicon layer or plate to the metal layer or base such as to provide a substantially pure ohmic contact without the formation of a barrier layer or junction between the silicon and metal surfaces liable to impair the performance and efficiency of the rectifier. It has been found, even with the use of a carrier metal having a coefficient of thermal expansion equal to or approximating the coefficient of expansion of the silicon, that a substantial transition resistance may still exist between the silicon layer and the base or carrier metal after the alloying and soldering operations carried out by a single heating step or treatment. This, in turn, may give rise to an early deterioration and destruction of the silicon plate or layer by the heat developed by the current during high power operation of the rectifier.

Accordingly, an important object of the present invention is to substantially overcome the foregoing and related difficulties by the provision of an improved silicon rectifier and the like semiconductor device of the above type, whereby the transition resistance between the semiconductor layer and the carrier metal or base is reduced to a minimum.

Another object of the invention is the provision of a high power silicon rectifier, in which the formation of a barrier layer between the semiconductor plate or layer and the metal carrier or base being in large-surface heat exchanging contact with the former is substantially prevented.

Yet another object of the invention is the provision of an improved silicon rectifier of this type embodying a thin semiconductor plate or layer being in large surface electrical and heat exchanging contact with a carrier metal or base layer having a like coefficient of thermal expansion to that of the semiconductor material, whereby damage to or destruction of the semiconductor due to heating is substantially prevented within a substantial range of operating current or temperature variations.

The invention, both as to its ancillary objects and novel aspects, will be better understood from the following detailed description of a preferred embodiment taken in conjunction with the accompanying drawing, forming part of this specification and in which:

FIG. 1 is a cross-sectional view of a junction power rectifier constructed in accordance with the principles of the invention; and FIG. 2 is a partial view showing in greater detail and on an enlarged scale the construction of the rectifier unit of FIG. 1.

With the foregoing objects in view, the invention involves generally the utilization of a soldering layer connecting the plate or layer of silicon with its metallic carrier layer or base and consisting of an alloy of predetermined composition such as to substantially avoid the formation of any barrier layer or increased transition resistance between the semiconductor and carrier metal, on the one hand, and to substantially prevent damage to or destruction of the semiconductor as a result of extreme heating cycles or variation of temperature during operation, on the other hand. For this purpose, a triple silver soldering alloy composed of 65% to 75% as to weight of sliver, 20% to 30% as to weight of copper and 1% to 10% as to weight of tin has been found to produce satisfactory results in minimizing the transition resistance between the semiconductor and metal base, in such a manner as to prevent overheating and reduced life of the rectifier. For practical purposes and more particularly in the case of silicon used as semiconductor material, the triple alloy found to be most effective may consist of 70% as to weight of silver, 25% as to weight of copper and 5% as to weight of tin. These values may be varied plus minus 2% without materially affecting the results obtained.

The invention further contemplates the utilization of a soldering layer of this composition connecting the semiconductor with its carrier layer or base and having a predetermined thickness relative to the thickness of the semiconductor such as to prevent deterioration or destruction of the latter under the effect of extreme temperature variations or heating cycles during operation.

Referring more particularly to the drawing, FIG. 1, there is shown, by way of example, a silicon power rectifier construction comprising a drawn cup 10 of copper or the like high heat conducting material, to provide a housing for the rectifier unit and to serve as heat dissipating or cooling means for which purpose cup 10 may be fitted with a number of cooling fins 11, 12, 13 and 14. The latter, in the construction shown, may be provided with central bores formed with cylindrical flanges 15 closely fitting the outside of the cup 10 and being connected thereto by welding, brazing, or in any other suitable manner. Connected to the bottom of the cup 10 through a layer of solder 21 is the rectifier unit or assembly proper collectively designated by the numeral 18 in FIG. 1.

The rectifier unit, as shown in greater detail in FIG. 2, may comprise a thin disk or layer 22 of mono-crystalline silicon of one conductivity type, such as N in the example being described. The silicon disk or layer 22 is connected at its undersurface to a layer or disk 23 of molybdenum or the like metal having an equal or approximately equal coefficient of thermal expansion to that of the silicon, the connection of the disks or layers 22 and 23 being effected through an intervening soldering disk or layer 24. The latter according to the present invention may consist of a triple alloy or silver solder composed of 70% as to weight of silver, 25% as to weight of copper and 5% as to weight of tin.

In order to ensure a reliable and effective soldering connection between the silicon layer 22 and metal layer or base 24 and, furthermore, in order to safely avoid the possibility of the silicon becoming damaged or destroyed as a result of relatively large operating temperature variations during the normal use of the rectifier, it has been found advisable to utilize a soldering layer 24 of predetermined minimum thickness, that is, of at least 20% to 40% of the thickness of the silicon layer 22, in contrast to the more obvious tendency to use a soldering layer of as small a thickness as possible. Satisfactory results have been achieved in practice by the use of a soldering disk or layer having a thickness of about 30% of the thickness of the silicon or other semiconductor layer.

Overlying the upper surface of the silicon layer 22 is a disk or layer 25 of aluminum serving as an impurity metal of opposite conductivity type, which as a result of the alloying process described presently has become in part fused or alloyed into the silicon layer 22, in such a manner as to produce a barrier layer or PN-junction indicated by the dotted line 26 in the drawing. In turn overlying the aluminum layer or disk 25 is a layer or disk 27 of molybdenum or other metal having a like coefficient of thermal expansion to that of the silicon, to which molybdenum layer may be soldered a terminal rod 29 of copper or the like metal through a tin or soldering layer or disk 28. The upper end of the rod 29 is formed, in the example shown, with a diametrical slot 30 wherein is mounted by pressfit or the like connection a terminal tab or lead 31, said lead being locked against pull out by means of a punch leaving a U-shaped depression 32 and being further secured in position by a soldering connection with the rod 29 (not shown).

In the fabrication of a semiconductor unit as described, a first disk 23 of molybdenum, a disk 24 consisting of the silver-copper-tin soldering alloy as described herein, an N-conductivity type silicon disk 22, an aluminum disk 25 and a second disk 27 of molybdenum or equivalent metal are superimposed one upon the other in the order shown in a graphite mold or boat, to form a stacked assembly or unit. The latter is then placed in a heating oven and heated to about 900° to 950° C. in an inert atmosphere, being maintained at this temperature for about two minutes. During this heat treatment, the aluminum 25 is fused or alloyed into the silicon 22 to form a PN-junction or barrier layer 26, while at the same time the silver solder or disk 24 is caused to melt and to unite with the silicon layer 22 and the molybdenum layer or base 23 and the aluminum layer or disk 25 acting as an alloying material forms an intimate contact connection with the molybdenum disk 27. Advantageously a small tin pellet may be placed upon the upper surface of the molybdenum disk 27 to be melted during the soldering and alloying process and, similarly, a second tin pellet or pellet of a different soldering material may be placed in contact with the undersurface of the molybdenum disk 23, whereby to cause said pellets to melt and spread, to form soldering layers 28 and 21, respectively. This will afford a substantial simplification in the subsequent production of low-ohmic contact or soldering connections joining the rectifier unit to the housing 10 and to the terminal rod 29, respectively, thereby ensuring safe and reliable high power operation of the rectifier.

In the foregoing the invention has been described in reference to a specific illustrative device. It will be evident, however, that variations and modifications, as well as the substitution of equivalent elements and materials for those shown and described herein for illustration, may be made without departing from the broader spirit and purview of the invention as set forth in the appended claims. The specification and drawing are accordingly to be regarded in an illustrative rather than in a restrictive sense.

We claim:

1. A semiconductor device comprising a thin layer of mono-crystalline silicon, a metallic layer forming a contact member of highly heat conducting material and having a coefficient of thermal expansion equal to that of silicon, and a soldering layer joining said metallic layer in low-ohmic contact to one surface of said silicon layer, said soldering layer having a thickness of from 20% to 40% of the thickness of said silicon layer and consisting of an alloy composed of 65% to 75% as to weight of silver, 20% to 30% as to weight of copper, and 1% to 10% as to weight of tin.

2. A high power semiconductor rectifier comprising a layer of mono-crystalline silicon of one conductivity type, a first metallic layer having a coefficient of thermal expansion substantially equal to that of silicon, a soldering layer joining said metallic layer in large-surface and low-ohmic contact to one surface of said silicon layer, said soldering layer consisting of an alloy composed of 65% to 75% as to weight of silver, 20% to 30% as to weight of copper and 1% to 10% as to weight of tin, a second metallic layer also having a coefficient of thermal expansion equal to that of silicon, and a layer of impurity material between the opposite surface of said silicon layer and said second metallic layer forming a PN-junction with said silicon layer and being in a low-ohmic contact connection with said second metallic layer, respectively.

3. A semiconductor rectifier as claimed in claim 2, said soldering layer consisting of an alloy composed of 70% as to weight of silver, 25% as to weight of copper and 5% as to weight of tin.

4. A semiconductor rectifier as claimed in claim 2, said soldering layer having a thickness equal to about 30% of the thickness of said silicon layer.

5. A semiconductor rectifier as claimed in claim 2, said metallic layers consisting of molybdenum.

6. A high power semiconductor rectifier comprising a layer of mono-crystalline N-conductivity type silicon, a first molybdenum layer, a soldering layer joining said molybdenum layer in large-surface and low-ohmic contact with one surface of said silicon layer, said soldering layer having a thickness of about 30% of the thickness of said silicon layer and consisting of an alloy composed of about 70% as to weight of silver, 25% as to weight of copper and 5% as to weight of tin, a second molybdenum layer, and a layer of aluminum between the opposite surface of said silicon layer and said second metallic layer forming a PN-junction with said silicon layer and being in a low-ohmic contact connection with said second molybdenum layer, respectively.

7. A semiconductor rectifier as claimed in claim 6 including heat dissipating means of high thermal conductivity connected to said metallic layers.

8. A semiconductor rectifier as claimed in claim 7, said last means being comprised of a cup-shaped housing of high heat conducting metal, a soldering layer connecting said first metallic layer to the bottom of said housing, a rod-shaped terminal member of high heat conducting metal, and a further soldering layer connecting one end of said member to said second metallic layer with the opposite end of said member protruding from said housing, and a mass of insulating sealing material filling said housing.

References Cited by the Examiner

UNITED STATES PATENTS

| | | | |
|---|---|---|---|
| 2,763,822 | 9/56 | Frola et al. | 29—504 |
| 2,853,661 | 9/58 | Houle et al. | 317—235 |

DAVID J. GALVIN, *Primary Examiner.*

SAMUEL BERNSTEIN, *Examiner.*